Dec. 27, 1960

J. B. MACKAY 2,966,598

SUPERCONDUCTOR CIRCUITS

Filed Dec. 23, 1957

2 Sheets-Sheet 1

INVENTOR
JAMES B. MACKAY

BY John E. Dougherty Jr.

ATTORNEY

United States Patent Office 2,966,598

Patented Dec. 27, 1960

2,966,598

SUPERCONDUCTOR CIRCUITS

James B. Mackay, Poughkeepsie, N.Y., assignor to International Business Machines Corporation, New York, N.Y., a corporation of New York Filed Dec. 23, 1957, Ser. No. 704,455

12 Claims. (Cl. 307—88.5)

The present invention relates to superconductor circuitry and more particularly to superconductor circuitry employing cryotron type devices, that is, devices which comprise a gate conductor of superconductor material associated with one or more control conductors which may be energized and de-energized to drive the gate conductor between normal and superconductive states.

The phenomenon of superconductivity has been known for a great many years and a large amount of research effort has been expended in the investigation of superconductor materials and their characteristics. More recently, as new and more efficient low temperature refrigeration equipment has been developed, a great deal of interest and effort has been directed toward the possible applications of superconductor devices in electric and electronic functional circuits. For a theoretical discussion of superconductivity, reference may be made to the book entitled "Superconductivity" by D. Shoenberg, the second edition of which was published in 1952 by the Syndics of the Cambridge University Press. Examples of some of the relatively early superconductor circuit applications are described in U.S. Patents Nos. 2,666,884; 2,704,431; and 2,725,474, issued respectively on January 19, 1954; March 22, 1955; and November 29, 1955. Further examples of superconductor circuitry are found in an article by Dudley Buck which appeared in the Proceedings of the IRE, pp. 482–493, April 1956. This article is particularly directed toward superconductor circuits usable in computers and the basic device proposed for use in such circuits is a device which is termed a cryotron and which comprises a gate conductor of superconductor material around which is wound one or more control coils. The gate conductor is maintained at a temperature below that at which it becomes superconductive and superconductivity may be selectively quenched by energizing the control coil or coils so that a field in excess of the critical field necessary to cause a transition to a normal state at the particular operating temperature is applied to the gate. The present invention employs devices of this type and has for its main object the provision of novel and improved superconductor circuits such as might be employed in computers and other data handling systems.

A further broad object of this invention is to provide improved superconductor circuits for controlling the division of current between parallel superconductor paths.

Another object is to provide improved superconductor circuits capable of assuming a plurality of different stable states and, more specifically, improved bistable superconductor circuits.

These objects and others set forth below are achieved, as is illustrated in the embodiments of the invention described herein by way of illustration, by employing cryotron type devices having a first control conductor which is connected in series with its own gate conductor so that the response of the device to magnetic fields applied by a second control conductor magnetically coupled to the first conductor is dependent not only upon the intensity of this applied field but also upon the current carrying condition of the cryotron gate, and, therefore, series connected control conductor, when such fields are applied. One embodiment of the invention employs such a device in a latch type circuit which may be utilized to indicate when the flow of current to a network of computer or other type functional circuits is interrupted. In this circuit, a first cryotron of the above-described type is connected in parallel with a second cryotron having a gate about which two magnetically coupled control conductors are wound. One control conductor on this second gate and the second control conductor on the gate of the first cryotron are connected in a series circuit which carries the supply current to the computer network and, when this current is in these control conductors, both apply fields greater than the critical field in the vicinity of their associated gate conductors. The other control conductor associated with the second cryotron gate applies a bias field to this gate. This bias field is in excess of the critical field but is in opposition to the field applied by the control conductor through which the supply current is flowing. The circuit is initially set with all the current in the indicator or latch circuit flowing through the second gate and this condition, once established, is stable since this gate is superconductive and the first gate is held resistive by the flow of supply current. However, when and if the supply current is interrupted, the second gate is driven resistive by the now unopposed bias field and the first gate becomes superconducting, thereby causing the indicating circuit current to switch to the first gate and thus to pass through its series connected control conductor. This control conductor then applies to the series connected gate a field which opposes that applied when the supply current is restored so that the indicator circuit remains latched in this condition indicative of the interruption of the flow of supply current.

Another embodiment of the invention is directed toward a binary input trigger circuit, that is, a circuit capable of assuming first and second stable states and of being switched back and forth between these states by each of a series of like pulses applied at a single input terminal. The bistable circuit employed is essentially that shown in the aforementioned article which appeared in the Proceedings of the IRE with the binary input feature being achieved by utilizing two cryotrons each of which has one separate control conductor connected in one side of the bistable circuit and one control conductor connected in series with its own gate. The gates are connected in parallel with the binary input terminal and the input signals are steered to the proper control coil for the bistable circuit in accordance with the initial distribution of current in the bistable circuit. Once the input current signal is applied through the one of these input gates which is then in a superconductive state, this current distribution in the input circuit is maintained until complete switching of the bistable circuit is accomplished. This is due to the fact that the field applied to the gate conductor by its series connected control conductor opposes the field which is applied as the current in the bistable circuit is shifted to energize the other control conductor associated with this gate and thereby condition the input circuit for proper operation when the next input signal is applied.

Therefore, another object of the invention is to provide improved superconductor circuits employing cryotron type devices having a plurality of control conductors at least one of which is connected in series with its own gate conductor.

A further object is to provide superconductor circuitry utilizing cryotron type devices wherein the response of the device to fields applied by an externally connected control conductor is dependent on the current carrying condition of the gate conductor when such a field is applied.

Still another object is to provide an improved superconductor latch circuit.

A further object is to provide a superconductor binary input trigger circuit.

A feature of the invention lies in the provision of a signal steering circuit utilizing two cryotron type devices each having at least one control conductor connected in series with its own gate conductor.

Another object is to provide cryotron circuits employing cryotron gates connected in parallel circuit relationship wherein current distribution is dependent not only upon the control fields applied to the gate conductors by control conductors connected to external circuitry but by the current carrying condition of the gate conductors when such a field or fields are applied.

Other objects of the invention will be pointed out in the following description and claims and illustrated in the accompanying drawings, which disclose, by way of example, the principle of the invention and the best mode, which has been contemplated, of applying the principle.

Figure 1:
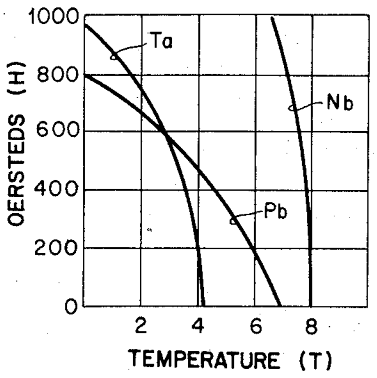
Fig. 1 is a plot depicting the magnetic field-temperature transition characteristics for a number of superconductive materials.

There is shown in Fig. 1 a plot depicting the transition temperatures (T) for a plurality of materials in the presence of different intensities of magnetic field (H). For example, tantalum (Ta) is shown to undergo a transition from a normal to a resistive state at approximately 4.4° K. when no magnetic field is present. This transition temperature is lowered as magnetic fields of increasing intensity are applied to the material. The state of the various materials, superconductive or normal, for different temperature-field conditions is ascertained by whether the particular condition is to the left or right of the curve for the material; for temperature-field conditions which are represented to the left of the curve, the material is superconductive and for those to the right of the curve, the material is in a resistive or normal state. The curve for any material may vary somewhat according to the purity of the sample used and manner in which it is prepared. For example, considering tantalum maintained at a temperature of 4.2° K., which is a convenient temperature since it is the temperature at which liquid helium boils at atmospheric pressure, the material remains in a superconductive state as long as the intensity of magnetic field to which it is subjected is below a transition field which may vary for different samples from about 50 to 100 oersteds. For the purposes of this disclosure, the tantalum employed is considered to have a threshold field of 50 oersteds at a temperature of 4.2° K. When this value of field intensity is exceeded, superconductivity in the material is quenched, that is, the material undergoes a transition from the superconductive to the normal state. From the plot it also appears that at this operating temperature both lead and niobium remain in a superconductive state in the presence of fields having an intensity much greater than the threshold field for tantalum. Niobium in the absence of a magnetic field has a transition temperature of 8° K. and at 4.2° requires a threshold field in excess of 1000 oersteds to switch it from a superconductive to a normal state. For the illustrative purposes of this disclosure only, and not by way of limitation, the cryotrons hereafter discussed will be considered to be maintained at an operating temperature of 4.2° K. and to comprise tantalum gate conductors requiring a threshold field of 50 oersteds and niobium control conductors. Other operating temperatures and other combinations of materials may be employed. For example, at operating temperatures slightly below 3.72° K., which is the transition temperature for tin, cryotrons fabricated of tin gate conductors and lead control conductors may be employed. For more complete data on these and other superconductive materials and on appratus for attaining temperatures in the vicinity of absolute zero, reference may be made to the above cited publications.

Figure 2:
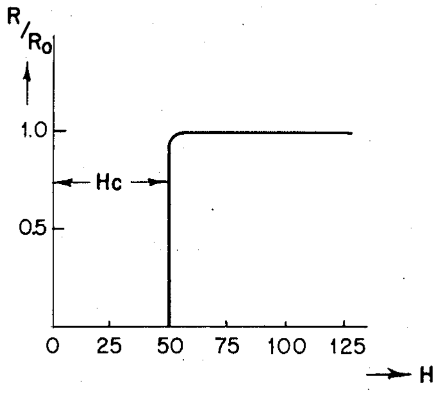
Fig. 2 depicts the magnetically induced superconductor transition characteristic of a sample of tantalum held at a temperature of 4.2° K.

The nature of the transition between superconductive and normal states for a tantalum wire maintained at 4.2° Kelvin is indicated in Fig. 2. The abcissa of the plot represents the intensity of the magnetic field (H) applied to the tantalum and the ordinate represents the ratio of the actual resistance of the tantalum (R) to its resistance in a normal or resistive state (Ro). As indicated in the plot, the resistance remains essentially zero for field intensities below 50 oersteds. However, when the intensity of a magnetic field applied to the wire is increased above this threshold value, which is represented in the figure by the designation H*c*, the tantalum undergoes a transition and assumes its normal or resistive state. The transition is reversible with no observable hysteretic effects and the tantalum reassumes the superconductive state when the intensity of applied field is lowered below 50 oersteds. The transition occurs very rapidly and, as is indicated by the curve, sharply defines the normal and resistive states for the tantalum.

Figure 3:
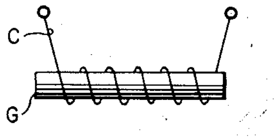
Fig. 3 shows a wire wound cryotron having a single control coil.
Figure 4:
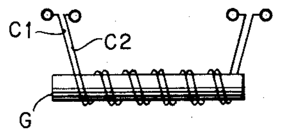
Fig. 4 shows a wire wound cryotron having a pair of superimposed control coils.

Fig. 3 is a diagrammatic representation of a cryotron such as is shown and described in the above-cited article by Dudley Buck. The cryotron comprises a gate conductor G of tantalum about which is wound a single coil C of niobium. As is also indicated in the cited article, cryotrons may be fabricated utilizing a plurality of superimposed control windings each of which, when energized, applies a magnetic field to the gate of tantalum so that the net field applied to the gate is actually the sum or difference of these individual fields according to whether they are applied in the same or in opposite directions. An arrangement of this type is shown in Fig. 4, the two superimposed coils embracing gate G being designated C1 and C2.

During the operation of cryotrons in circuitry such as is about to be described, current is often caused to flow through a cryotron gate conductor at the same time at which energizing currents are applied to one or more control conductors. This gate current produces a magnetic field which is at right angles to the field applied by the control coil or coils. The field intensity adjacent the gate element in such a case is determined by quadrature addition of the coil and gate fields. In order that the cryotrons be usable in circuits in which one drives the other, they must be fabricated to have current gain and, for this reason, the effect of the self field of the gate relative to the field applied by the coil is kept at a minimum. Though it is recognized that the self field of the gate conductor must be considered in determining the actual field intensity of magnetic field applied thereto at any instant, in order to facilitate the explanation of the circuitry about to be described, only the fields applied by a coil or coils associatetd with each gate will be considered. For a fuller explanation of quadrature addition of fields produced by current in gate and control conductors, reference may be made to copending application, Serial No. 677,239, filed August 9, 1957, in behalf of D. R. Young and assigned to the assignee of this application.

Figure 5:
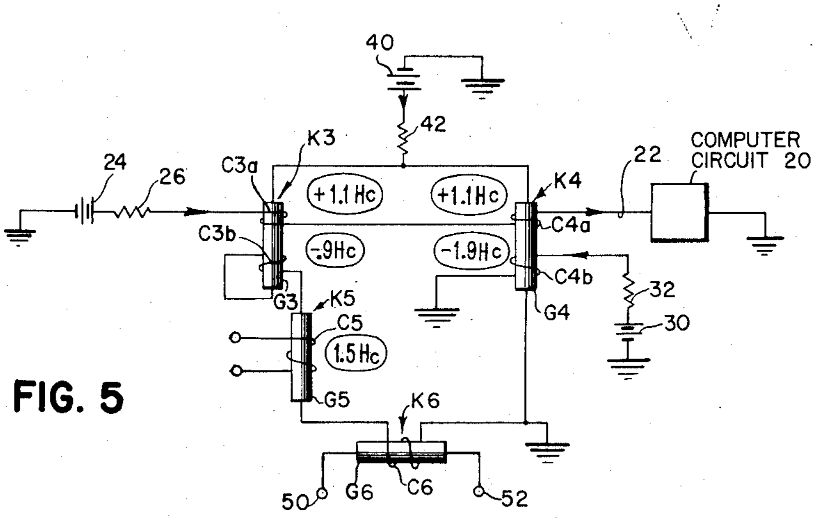
Fig. 5 is a diagrammatic representation of a superconductor latch circuit.

Referring now to Fig. 5, there is shown a circuit embodying the present invention which utilizes both single and double coil cryotrons. The circuit is a latch type circuit which is employed to indicate when the current in a particular line is, for any reason, interrupted. Cryotron computer circuitry, such as the cryotron flip flops described in the above cited article by Dudley Buck which appeared in the Proceedings of the IRE, is essentially dependent upon a continued current flow from what may be a single current source. The circuit of Fig. 5 may be utilized to indicate when the current from this source has been interrupted for a time sufficient to alter the state of the flip flops and other cryotron devices in a computer with which the circuit is employed. A box designated 20 is used to represent the circuits which may, for example, constitute a network of cryotron flip-flops employed to perform one or more functions in a computer. These circuits receive their D.C. current from a line 22 which is connected to a constant current source represented in the figure by a battery 24 and resistor 26. The circuit of Fig. 5 which serves to indicate interruptions in the current supplied by this source to the circuitry represented by box 20, includes four cryotrons which are designated K3, K4, K5, and K6. The gates of these cryotrons are designated G3, G4, G5, and G6. Each of the cryotrons K5 and K6 has a single control winding, C5 and C6, respectively, and the cryotrons K3 and K4 are each provided with two control windings designated C3*a* and C3*b*, and C4*a* and C4*b*, respectively. The pairs of control windings on cryotron K3 and K4 are superimposed in the manner indicated in Fig. 4, though the actual superposition is not shown in Fig. 5 in order that the connection to the various gate and control conductors might be more clearly illustrated.

The control coils C3*a* and C4*a* on cryotrons K3 and K4 are actually part of the series circuit connecting line 22 to battery 24. The pitch of these windings and the constant current normally flowing in this circuit is such that each applies to its associated gate a magnetic field which is greater than the threshold field H*c* for the gate (see Fig. 2). Specifically, in the illustrative embodiment shown, each winding applies a field equal to +1.1 times the threshold or critical field intensity H*c* as is indicated by the encircled values adjacent the windings. The windings C4*b* on cryotron K4 is a bias winding which is connected to a constant current source represented by a battery 30 and resistor 32. The constant current supplied by this source, considering the pitch of winding C4*a* and C4*b* to be the same, is 1.9/1.1 times that flowing in the series circuit supplied by battery 24. Thus, winding C4*b* applies a bias field of —1.9 H*c* to gate G4, the negative sign indicating that this field is applied in a direction opposite to the direction of the field applied by winding C4*a*.

The second winding C3*b* on gate G3 is connected in series with this gate so that all of the current in the gate must necessarily flow through this winding. The latch or indicator circuit receives its current from a constant current source represented by a battery 40 and resistor 42, the current supplied being chosen such that when it flows entirely through gate G3, winding C3*b* is effective to apply to this gate a field in intensity equal to —.9 H*c*, the minus sign indicating that this field is applied to oppose the field applied by the other superimposed winding C3*a*.

Winding C5 on gate G5 is a control winding which is selectively energized with a current sufficient to render the winding effective to apply to the gate a field in intensity greater than the critical value, specifically 1.5 H*c*. When winding C5 is energized at a time when current is flowing from batteries 24, 30, and 40, the operation is as follows:

With both of the windings C4*a* and C4*b* energized, the net field applied to gate G4 is less than critical so that this gate is in a superconductor state. The energization of coil C5 renders gate G5 resistive so that regardless of the field applied to gate G3, all of the current from battery 40 is caused to flow in the entirely superconductive path including gate G4. Coil C5 is maintained energized for a time sufficient to ensure that this condition is established and is then de-energized.

Since both of the coils C4*a* and C4*b* remain energized, applying opposing fields to gate G4, this gate is subjected to a net field of —.8 H*c* and remains in a superconductive state. Since coil C3*b* remains de-energized with no current in the gate G3, the field applied by winding C3*a* is sufficient to maintain gate G3 resistive. As a result, once winding C5 is energized to establish this condition with all of the current from battery 40 in the side of the parallel circuit which includes gate G4, the condition persists after this winding is de-energized as long as there is no change in the current through the other windings.

However, when and if the current from battery 24 to line 22 is, for any reason, interrupted, windings C3*a* and C4*a* are de-energized. Gate G4 is then subject only to the field of winding C4*b* and is, therefore, driven resistive while gate G3, with the field of coil C3*a* removed, becomes superconductive. The current then shifts from the gate G4 to the other branch of the parallel circuit which includes gate G3, the time required for this current shift to be completed being dependent upon the *L*/*R* time constant of the circuit. When all of the current has shifted, the current in coil C3*b* applies a field equal to —.9 H*c* to gate G3. Since this field is less than critical, this gate remains superconductive. When the current in the supply circuit including coils C3*a* and C4*a* is restored, gate G3 remains superconductive since the field of coil C3*b* subtracts from that of coil C3*a*. The gate G4 again becomes superconductive, since the field of coil C4*a* subtracts from that of coil C4*b*. However, once the current is established in the completely superconductive path including gates G3 and G5, the subsequent rendering of the other parallel path superconductive will have no effect. This is due to the fact that, with all of the gates superconductive, there is formed a superconductive loop and one of the characteristics of the superconductive state is that the net flux linking a completely superconductive loop cannot be changed unless some resistance is introduced in the loop.

Therefore, it becomes apparent that once the current is interrupted in the supply circuit to the computer or other superconductive device represented by box 20, the indicating latch circuit is switched to a stable state with all of the current flowing in the path including gates G3 and G5. Once switched, the circuit becomes latched in this condition due to the regenerative connection between winding C3*b* and gate G3. The length of the current interruption in the supply circuit necessary to establish this latched condition is, of course, dependent upon the *L*/*R* time constant of the latch circuit. The time constant may be reduced by employing film type cryotrons and flux excluding cores and shields such as are shown and described in copending application Serial No. 625,512, filed November 30, 1956, in behalf of R. L. Garwin.

The output of the circuit may be taken by way of another cryotron having its control coil connected in either one of the parallel legs of the circuit. An example of this type of arrangement is shown by the coil C6 of cryotron K6 connected in the left side of the latch circuit. The gate G6 of this cryotron is in a nonresistive state when the latch circuit is in its normal condition, but is driven resistive when the current in the supply circuit is interrupted. The condition of the circuit may be ascertained by observing the resistance between a piar of terminals 50 and 52, or the cryotron K6 may have its gate G6 connected in further cryotron switching circuitry which is actuated when the current in the main supply line is interrupted.

As a further incident to the use of the regenerative winding C3*b* to obtain self latching of the circuit, it should be pointed out that it is not necessary that the length of the current interruption exceed the time constant of the circuit to obtain a stored indication of the fact that an interruption occurred. For example, employing the coils and currents to apply the values of field indicated, it is only necessary, in order to obtain a "latched" indication of an interruption, that the length of the interruption be sufficient to allow an amount of the current in excess of one ninth of the total current from battery 40 to be shifted from gate G4 to gate G3. When a shift of this much current is accomplished, winding C3*b* is effective to apply a field in excess of −.1 Hc in opposition to the field applied by winding C3*a* when it is reenergized. Gate G3, therefore, remains superconductive when the supply current is reestablished and the shifted current continues to flow through this gate. This current shifting is cumulative since each time the current in the main supply line including coils C3*a* and C4*a* is interrupted, a portion of the latch circuit current is shifted from gate G4 to gate G3 and the current distribution is always unaffected by the restoration of the supply current. Therefore, the construction of the cryotrons and the time constant of the latch circuit may be altered in accordance with the characteristics of the computer circuitry represented by box 20 so that, for example, no current is permanently shifted except for a current interruption of sufficient length to disturb this computer circuitry. Where successive interruptions of shorter length also have deleterious effects, the arrangement may be such that sufficient current is shifted to cause gate G6 to be driven resistive either by a single interruption of predetermined length or a series of interruptions of shorter duration.

Figure 6:
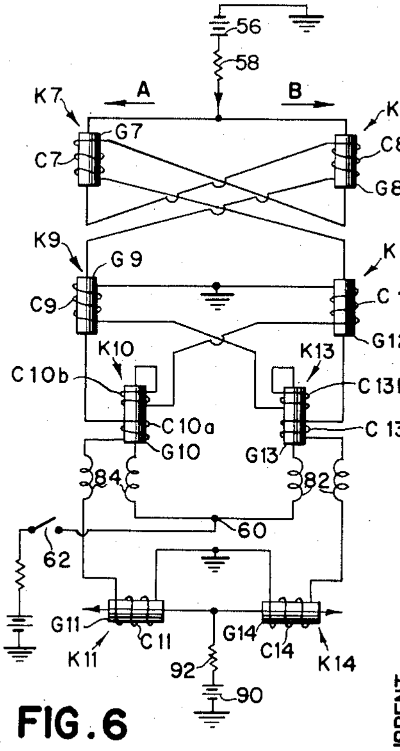
Fig. 6 is a diagrammatic representation of a superconductor binary input trigger circuit.

Fig. 6 is a diagrammatic representation of a binary input cryotron flip flop circuit. The circuit includes two parallel paths A and B through which current from a source represented by a battery 56 and resistor 58 may be caused to flow. Path A includes the gate G7 of a cryotron K7, the coil C8 of a cryotron K8, the gate G9 of a cryotron K9, one coil C10*a* of a double winding cryotron K10, and the coil C11 of a cryotron K11. The other path B includes gate G8, coil C7, the gate G12 of a cryotron K12, one coil C13*a* of a double winding cryotron K13, and the coil C14 of a cryotron K14. The circuit is of the general type shown in the above cited article by Dudley Buck which appeared in the Proceedings of the IRE. The cryotrons K7 and K8 are cross coupled, that is, the gate of each is connected in series with the control coil of the other, so that once current is established in either path, that current flows through a control coil embracing a gate in the other path to maintain that gate resistive and, therefore, the circuit stable in that condition.

The binary input to this trigger or flip flop circuit is applied at a terminal 60 under control of a switching circuit herein illustratively represented at 62. The cryotrons K10 and K13 serve as a steering circuit to direct the input trigger pulses to the proper one of the input cryotrons K9 or K12 so that the circuit is switched from the state that it is in to the opposite state upon the receipt of each trigger pulse. Windings C13*a* and C13*b* of cryotron K13 and windings C10*a* and C10*b* of cryotron K10 are actually superimposed in the manner shown in Fig. 4. Each of the windings C10*b* and C13*b* is series connected with its own gate so that all of the current in the gate must also necessarily flow in the winding. The current signals applied at terminal 60 are such that when this entire current flows through either of the windings C10*b* or C13*b*, that winding is effective to apply to the embraced gate a field in intensity equal to −0.75 Hc. The windings C10*a* and C13*a* are connected in paths A and B, respectively, and the current supplied by the source represented by battery 56 and resistor 58 is such that, when the entire current is flowing in either path, the one of these coils which is connected in that path applies to the embraced gate a field in intensity equal to +1.5 Hc. As before, the plus and minus signs are employed merely to indicate that fields applied by the two superimposed coils on each of the cryotrons K10 and K13 are in opposite directions.

Figure 7:
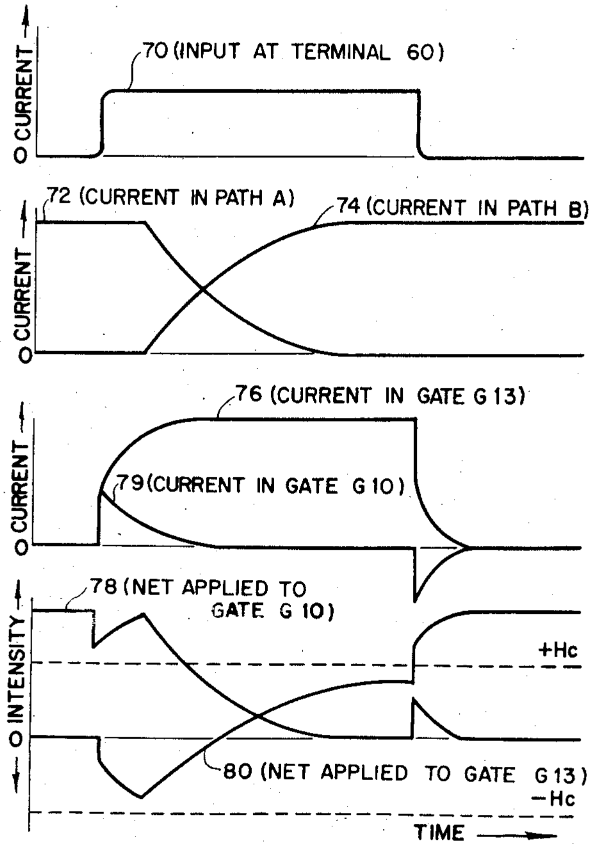
Fig. 7 is a plot depicting the manner in which current and magnetic field distribution changes when the circuit of Fig. 6 is switched from one stable state to the other.

The operation of the circuit may be best understood from a consideration of the pulse diagram of Fig. 7 which shows the changes in current and magnetic field at various points in the circuit when a binary input signal is applied at terminal 60 with all of the current initially flowing in path A. The input current signal is represented by the curve 70. Since the current in path A renders winding C10*a* effective to apply a field of 1.5 Hc to gate G10 (see curve 78) and thereby holds this gate resistive, all of the current from terminal 60, after an initial transient in gate G10 (see curve 79), is directed through gate G13 which is in a superconductive state. This current flow is indicated by curve 76 and the resulting magnetic field initially applied to this gate by winding C13*b*, which is connected in series with the gate, is shown by curve 80. Gate G13 is connected in series with control coil C9 of cryotron K9 and shortly before the applied current pulse through this winding has reached its maximum value, the embraced gate G9, which is connected in path A, is driven resistive. At this time, as is indicated by curves 72 and 74, the current from battery 56 begins to shift from path A to path B causing the field applied by winding C10*a* to gate G10 to be diminished (curve 78) and that applied by winding C13*a* (curve 80) to gate G13 to be increased. The field applied by windings C13*a* and C13*b* to gate 13 are in opposite directions, so that, as the field applied by winding C13*a* increases with the increase of current in path B, the net field applied to gate G13 varies from −.75 Hc, which is the maximum field applied by winding C13*b*, to +.75 Hc, which represents the difference between this field and the maximum field applied by winding C13*a* when all of the current has been shifted to path B. The pre-established current through gate G13 and series connected winding C13*b* prevents this gate from being driven resistive as the current is shifted from path A to path B.

During the current shifting operation gate G10 becomes superconductive as the current is shifted out of path A, and thus coil C10*a*, and into path B. However, this does not occur until all of the current applied at terminal 60 has been established in gate G13 and, as explained above, once a current has been established in one superconductive path, the condition will not be disturbed by subsequently rendering a parallel path superconductive. Therefore, all of the current is shifted into path B and when, upon termination of the input signal, winding C13*b* is deenergized, the current through winding C13*a* applies to gate G13 a field equal in intensity to 1.5 Hc to drive this gate resistive. The next input signal applied at terminal 60 is, therefore, directed through gate G10, winding C10*b* and winding C12 to drive gate G12 resistive and cause the circuit to be flipped back to the other stable state with the current from battery 56 in path A.

The superimposed windings C10*a* and C10*b*, and C13*a* and C13*b*, are inductively coupled and each is effective when being energized or deenergized to induce a current in the other. This mutual inductance could have deleterious effects during the switching operation. For example, in the operation described above, as the current is switched from path A to path B, windings C10*a* and C13*b* induce currents in windings C10*b* and C13*b*. These induced currents are additive and could possibly alter the established distribution of current between gates G10 and G13. In order to obviate this possibility, two pairs of mutual inductance coils 82 and 84 are added to the circuit. The mutual inductance of each of these pairs of coils is equal in magnitude and opposite in direction to that of the superimposed windings on cryotrons K10 and K13 and, therefore, the coils effectively cancel out the mutual inductance between the superimposed coils on the cryotron gates.

Figure 8:
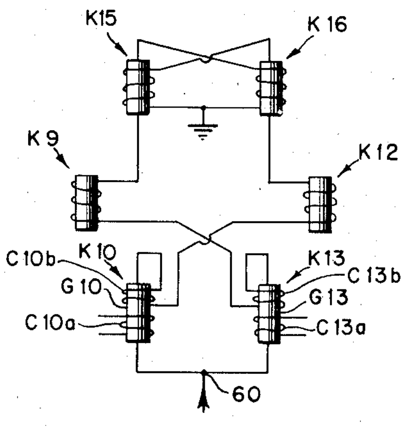
Fig. 8 shows a different embodiment of an input circuit usable in the trigger circuit of Fig. 6.

Another method of obviating the possibility of harmful effects due to the mutual inductance between coils C10*a* and C10*b* and between coils C13*a* and C13*b* is shown in Fig. 8. Here, only a portion of the circuit is shown, with like designations being applied to elements corresponding to those shown in Fig. 6. In this circuit, the mutual inductance coils 82 and 84 are eliminated and, instead, a pair of cross coupled cryotrons K15 and K16 have been added to the input circuit. Each of these cryotrons has its gate connected in one of the two parallel branches of the input circuit and, since each has its coil connected in series with the gate of the other, the two are effective to maintain current flow through either side of the parallel input circuit once it is established. Therefore, once an input signal is directed to one or the other of the two parallel branches of the input circuit in accordance with the state of gates G10 and G13, a corresponding one of the gates of the cross coupled cryotrons K14 and K15 will be driven resistive and held resistive by this current flow and the mutual inductance effects of the superimposed coils on cryotrons K10 and K13 will not alter the established current condition of the input circuit.

The output of the binary input circuit, whether employing the mutual inductance coils shown in Fig. 6 or the cross coupled cryotrons of Fig. 8, is taken by way of a pair of cryotrons K11 and K14. The coils C11 and C14 of these cryotrons are connected in paths A and B, respectively, so that when the flip flop circuit is in one stable condition with current in path A, the gate G11 of cryotron K11 is resistive and gate G14 of cryotron K14 is superconductive and, when in the other stable state, gate G11 is superconductive and gate G14 is resistive. These gates are connected in parallel with a current source represented by a battery 90 and resistor 92 and the state of the flip flop circuit is continuously manifested by the one of these gates in which current from this source is observed to flow.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention therefore, to be limited only as indicated by the scope of the following claims.

What is claimed is:

1. In a superconductor circuit including a current source connected in parallel circuit relationship with a plurality of current paths, means for controllng the distribution of current from said source in said paths comprising, in combination, cryotron gate conductors connected in at least certain of said paths, cryotron control conductors associated with said cryotron gate conductors, each said control conductor being effective when energized to apply a magnetic field to the associated gate conductor, at least one of said cryotron control conductors being connected in series circuit relationship with a cryotron gate conductor with which it is associated so that all of the current from said source which flows through this gate conductor also necessarily flows through this associated series connected control conductor, said series connected control conductor being effective when the entire current from said source is caused to flow therethrough to apply to said associated gate conductor a magnetic field less than the critical field necessary to cause said gate conductor to undergo a transition from a superconductive to a normal state.

2. In a superconductor circuit, first and second superconductor gate conductors maintained at a temperature below that at which they undergo transitions from a normal to a superconductive state in the absence of a magnetic field, a first control conductor associated wtih said first gate conductor for applying magnetic field to said first gate conductor, said first gate conductor and said first control conductor being connected in series circuit relationship, said second gate conductor being connected in parallel circuit relationship with said series connected first control conductor and first gate conductor, second and third control conductors associated with said first and second gate conductors for applying magnetic field to said first and second gate conductors, respectively, and means coupling said second and third control conductors to the same current source.

3. In a superconductor circuit comprising first and second parallel current paths, first and second superconductor gate conductors connected in said first and second parallel paths, respectively, a further superconductor conductor connected in said first path in series with said first conductor and effective when energized by current therethrough to produce a magnetic field in the vicinity of said first gate conductor, the magnetic field produced by said further conductor being less than the critical field necessary to cause said first gate conductor to undergo a transition from a superconductive to a resistive state, and first and second control conductors connected in series circuit relationship and associated with said first and second gate conductors, respectively, for applying magnetic fields to said first and second gate conductors, respectively.

4. In a superconductor circuit comprising first and second parallel current paths, first and second superconductor gate conductors connected in said first and second parallel paths, respectively, first and second superconductor bias conductors connected in said first and second paths in series with said first and second gate conductors, respectively, each of said first and second bias conductors being effective when energized to produce a magnetic field in a first direction in the vicinity of the one of said gate conductors with which it is series connected, said magnetic fields produced by said bias conductors being less than the critical field necessary to drive said gate conductors resistive, and first and second control conductors associated with said first and second gate conductors, respectively, for applying magnetic fields in a second direction to said first and second gate conductors, respectively.

5. In a superconductor circuit including first and second superconductor gate conductors connected in parallel circuit relationship to form a bistable circuit in which at least a major portion of current from a source flows through said first gate conductor when the circuit is in a first stable state and through said second gate conductor when the circuit is in a second stable state, first and second control conductors associated with said first and second gate conductors, respectively, for switching said circuit between said stable states by applying magnetic fields to the associated gate conductors; and means for directing input signals applied at an input terminal to the one of said control conductors which is associated with the gate conductor through which said current in said bistable circuit is then flowing comprising, third and fourth superconductor gate conductors connected in parallel circuit relationship with respect to said input terminal, said third and fourth gate conductors being connected in series circuit relationship with said second and first control conductors, respectively, a third control conductor connected in series circuit relationship with said third gate conductor and effective when energized to apply magnetic field to said third gate conductor, and a fourth control conductor connected in series circuit relationship with said first gate conductor and effective when energized to apply magnetic field to said third gate conductor.

6. In a superconductor circuit including first and second superconductor gate conductors connected in parallel circuit relationship to form a bistable circuit in which at least a major portion of current from a source flows through said first gate conductor when the circuit is in a first stable state and through said second gate conductor when the circuit is in a second stable state, first and second control conductors associated with said first and second gate conductors, respectively, for switching said circuit between said stable states by applying magnetic fields to the associated gate conductors; and means for directing input signals applied at an input terminal to the one of said control conductors which is associated with the gate conductor through which said current in said bistable circuit is then flowing comprising, third and fourth superconductor gate conductors connected in parallel circuit relationship with respect to said input terminal, said third and fourth gate conductors being connected in series circuit relationship with said second and first control conductors, respectively, a third control conductor connected in series circuit relationship with said third gate conductor and effective when energized to apply magnetic fields to said third gate conductor, a fourth control conductor connected in series circuit relationship with said first gate conductor and effective when energized to apply magnetic field to said third gate conductor, a fifth control conductor connected in series circuit relationship with said fourth gate conductor and effective when energized to apply magnetic fields to said fourth gate conductor, and a sixth control conductor connected in series circuit relationship with said second gate conductor and effective when energized to apply magnetic field to said fourth gate conductor.

7. In a superconductor circuit, a current source, first and second branch circuits extending in parallel circuit relationship with respect to said source, said first branch circuit including as a part thereof a first superconductor gate, a first control conductor means associated with said first gate for controlling said first gate between a superconductive and normal states, said second branch circuit including as a part thereof in parallel relationship with said first gate in said first branch circuit a second superconductor gate and a second control conductor connected in series with said second gate, said second control conductor being effective when energized by current flow through said second branch circuit to apply to said second gate a magnetic field which is insufficient of itself to cause said second gate to be driven from a superconductive to a normal state, and a third control conductor associated with said second gate effective when energized to apply a magnetic field to said second gate, said third control conductor being effective when energized to drive said second gate from a superconductive to a normal state when said current from said source is in said first branch circuit but being ineffective to drive said second gate from a superconductive to a normal state when said current from said source is in said second branch circuit.

8. In a superconductor circuit, a current source, first and second branch circuits extending in parallel circuit relationship with respect to said source, said first branch circuit including as a part thereof a first superconductor gate, a first control conductor means associated with said first gate for controlling said first gate between superconductive and normal states, said second branch circuit including as a part thereof a second superconductor gate and a second control conductor connected in series with said second gate so that all of the current flowing through said second gate necessarily flows through said second control conductor, said second control conductor being effective when energized by current flow through said second branch circuit to apply to said second gate a magnetic field which is insufficient of itself to cause said second gate to be driven from a superconductive to a resistive state, and a third control conductor associated with said second gate conductor effective when energized to apply a magnetic field to said second gate conductor, said third control conductor being effective when energized to maintain said second gate conductor in a normal state when less than a predetermined portion of said current from said source is in said second branch circuit but being ineffective to maintain said second gate conductor in a normal state when more than a predetermined portion of said current from said source is in said second branch circuit.

9. In a superconductor circuit; a superconductor current path including a gate conductor; a source of current connected to said path for supplying current thereto; a control conductor arranged adjacent said gate conductor effective when energized to produce a magnetic field for controlling the state, superconductive or normal, of said gate conductor; the current from said source when in said path being effective to produce in the vicinity of said gate conductor a magnetic field which is insufficient of itself to drive the gate conductor from a superconductive to a resistive state but which is sufficient to render the response of said gate conductor to control by said control conductor dependent upon the current from said source in said path when the control conductor is energized.

10. A current steering circuit comprising; first and second superconductor paths connected in parallel circuit relationship across a source of current; first and second superconductor gate conductors connected in said first and second paths, respectively; the current from said source when in said first path being effective to produce a magnetic field in the vicinity of said first gate conductor which is insufficient of itself to drive said first gate conductor from a superconductive to a resistive state; the current from said source when in said second path being effective to produce in the vicinity of said second gate conductor a magnetic field which is insufficient of itself to drive said second gate conductor from a superconductive to a resistive state; a first control conductor arranged adjacent said first gate conductor and effective when energized to produce a magnetic field sufficient to drive said first gate conductor resistive in the absence of the current from said source in said first path but insufficient to drive said first gate conductor resistive in the presence of the current from said source in said first path; a second control conductor arranged adjacent said second gate conductor and effective when energized to produce a magnetic field sufficient to drive said second gate conductor resistive in the absence of the current from said source in said second path but insufficient to drive said second gate conductor resistive in the presence of the current from said source in said second path; whereby, when said source supplies current to said parallel connected first and second paths at a time when one of said first and second control conductors is energized and the other is deenergized, the current is directed through a particular one of said first and second paths and remains therein even though said one of said first and second control conductors is thereafter deenergized and said other control conductor is energized.

11. In a superconductor circuit including a bistable circuit having first and second superconductor gate conductors connected in parallel circuit relationship; an input circuit coupled to said bistable circuit effective to switch said bistable circuit from the stable state it is in to the other of its stable states each time an input signal is applied thereto; said input circuit including third and fourth superconductor gate conductors connected in parallel circuit relationship across said terminal, first control conductor means arranged adjacent said third gate conductor including a first control conductor connected in series with said third gate conductor and a second control conductor connected in series with said first gate conductor, second control conductor means arranged adjacent said fourth gate conductor including a third control conductor connected in series with said fourth gate conductor and a fourth control conductor connected in series with said second gate conductor, and fifth and sixth control conductors respectively connected in series with said third and fourth gate conductors and respectively arranged adjacent said second and first gate conductors.

12. A current steering circuit for switching a bistable circuit between its stable states; said current steering circuit including first and second superconductor paths connected in parallel across a source of current; at least one output control conductor for said current steering circuit connected in one of said paths and arranged adjacent said bistable circuit; first and second gate conductors respectively connected in said first and second paths; a first control conductor arranged adjacent said first gate conductor for controlling said gate conductor between superconductive and resistive states; and a second control conductor arranged adjacent said second gate conductor for controlling said second gate conductor between superconductive and resistive states; the current from said source when in either of said paths being effective to produce in the vicinity of the one of said first and second gate conductors connected in that path a magnetic field insufficient of itself to drive the gate conductor resistive but sufficient to render the response of that gate conductor to control by the adjacently arranged control conductor dependent upon the presence or absence of current in that path.

References Cited in the file of this patent

UNITED STATES PATENTS

| | | |
|---|---|---|
| 2,644,887 | Wolfe | July 7, 1953 |
| 2,725,474 | Ericsson | Nov. 29, 1955 |
| 2,832,897 | Buck | Apr. 29, 1958 |

OTHER REFERENCES

Buck: "The Cryotron," IRE Proc., April 1956, pp. 482–493.